(12) United States Patent
Houston

(10) Patent No.: US 7,704,811 B2
(45) Date of Patent: Apr. 27, 2010

(54) SUB-LITHOGRAPHICS OPENING FOR BACK CONTACT OR BACK GATE

(75) Inventor: Theodore W Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/034,875

(22) Filed: Feb. 21, 2008

(65) Prior Publication Data

US 2008/0166839 A1     Jul. 10, 2008

Related U.S. Application Data

(62) Division of application No. 11/239,834, filed on Sep. 30, 2005, now Pat. No. 7,372,101, which is a division of application No. 10/010,653, filed on Nov. 8, 2001, now Pat. No. 6,972,448.

(60) Provisional application No. 60/259,301, filed on Dec. 31, 2000, provisional application No. 60/299,966, filed on Jun. 21, 2001.

(51) Int. Cl.
*H01L 21/84* (2006.01)

(52) U.S. Cl. .................. 438/157; 438/283; 438/479; 257/E21.409

(58) Field of Classification Search ................. 438/158, 438/595, 637, 639, 157, 195, 197, 283, 479; 257/E21.409, E21.177
See application file for complete search history.

(56) References Cited

U.S. PATENT DOCUMENTS

| | | | |
|---|---|---|---|
| 4,489,481 A * | 12/1984 | Jones | 438/623 |
| 5,359,220 A * | 10/1994 | Larson et al. | 257/378 |
| 6,043,535 A | 3/2000 | Houston | |
| 6,320,225 B1 * | 11/2001 | Hargrove et al. | 257/347 |
| 6,383,904 B1 * | 5/2002 | Yu | 438/589 |
| 6,580,132 B1 | 6/2003 | Chan et al. | |
| 6,759,315 B1 | 7/2004 | Furukawa et al. | |

* cited by examiner

*Primary Examiner*—Tuan N. Quach
(74) *Attorney, Agent, or Firm*—Warren L. Franz; Wade J. Brady, III; Frederick J. Telecky, Jr.

(57) ABSTRACT

A low resistance buried back contact for SOI devices. A trench is etched in an insulating layer at minimum lithographic dimension, and sidewalls are deposited in the trench to decrease its width to sublithographic dimension. Conducting material is deposited in the trench, which serves as a low-resistance contact to the back side of the device. In another embodiment, the trench-fill material is separated from the device by an insulating layer, and serves as a back gate structure.

12 Claims, 2 Drawing Sheets

SUB-LITHOGRAPHICS OPENING FOR BACK CONTACT OR BACK GATE

This is a divisional application of Ser. No. 11/239,834, filed Sep. 30, 2005 now U.S. Pat. No. 7,372,101, which is a divisional of Ser. No. 10/010,653, filed Nov. 8, 2001 now U.S. Pat. No. 6,972,448, and which claims priority under 35 USC §119(e) (1) of provisional applications Nos. 60/259,301, filed Dec. 31, 2000 and 60/299,966, filed Jun. 21, 2001.

BACKGROUND AND SUMMARY OF THE INVENTION

The present invention relates to integrated circuit structures and fabrication methods, and more particularly to creating conducting contact to transistor structures in semiconductor-on-insulator (SOI) devices.

BACKGROUND

Continued integrated circuit device scaling has caused the industry to move to relatively new material system such as semiconductor-on-insulator wafers and higher k materials, as well as new device structures, such as partially depleted SOI.

With partially depleted SOI it is possible to produce low voltage, low power devices as gates are scaled down in size. PD SOI has emerged as a leading technology for such high performance, deep submicron integrated circuits. PD SOI offers reduced parasitic capacitance associated with source and drain diffusion regions, as well as other advantages.

The main drawback of PD SOI technology is that the body of active material from which transistors are formed is floating, meaning it has no fixed voltage reference or ground. This leads to uncertainties in body potential and threshold voltage. For many circuit applications, the design margins imposed by this uncertainty can decrease potential circuit advantages.

With partially depleted SOI, it is often advantageous to have a low resistance contact to the body. A back side contact is a useful solution to this problem, but alignment of backside contacts brings its own difficulties. For example, misalignment can bring the conductor too close to one side of the transistor, disturbing threshold voltage and transistor performance.

With fully depleted SOI, the back gate has a strong influence on the transistor characteristics. It is desirable to have a thin back gate oxide. However, if the back gate overlaps the source or drain of the transistor, the thin back gate oxide leads to undesirably large parasitic capacitance. Again, as with the introduction of a back side contact to the body of the transistor, the alignment of the back gate is critical to performance and threshold voltage in a SOI design.

Sub-Lithographic Opening for Back Contact or Back Gate

The present application discloses a sub-lithographic conducting structure beneath the transistor structure. In a preferred embodiment, a trench is formed in the oxide at minimum lithographic dimension, and sidewalls are formed in the trench to further decrease width. The trench is then filled with a conducting material (preferably polysilicon).

In one class of embodiments, the conducting material serves as a low resistance back side contact to the transistor. By decreasing the width of the conducting trench fill material, the allowable margin of alignment error is increased. In another class of embodiments, the conducting material is separated from the body of the transistor by a layer of insulating material. In this case, the conducting material acts as a back gate.

Advantages of the disclosed methods and structures, in various embodiments, can include one or more of the following:
added alignment margin for back-side contact;
provides a low resistance contact to the body;
added alignment margin for back gate;
provides heat sink for channel region;
reduced capacitance of back gate to source or drain.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1A:
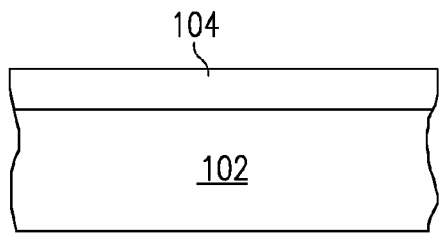
FIGS. 1a-1e show a partially fabricated integrated circuit structure at different process steps according to a preferred embodiment.
Figure 1B:
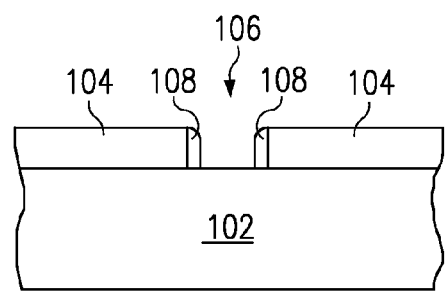

FIGS. 1a-1e show an embodiment of the innovative structure at different phases during processing. FIG. 1a shows a semiconductor body 102 with an insulating layer 104 thereon, preferably oxide. The insulating layer is about 500 nm thick. In FIG. 1b, a trench 106 has been etched into the insulating layer and sidewalls 108 have been deposited in the trench, narrowing the width. In the preferred embodiment, the trench is patterned and etched at minimum width possible given photolithographic limitations, about 100 nm wide, depending on the lithographic generation. Alternatively, the trench is etched wider than the minimum possible in order to relax fabrication requirements. The sidewalls that are deposited are preferably made of oxide and are about 20 nm thick, decreasing the width of the trench to about 60 nm, which is narrower than possible using only standard lithographic means. During sidewall formation, the sidewall material is deposited, followed by an anisotropic etch.

Figure 1C:
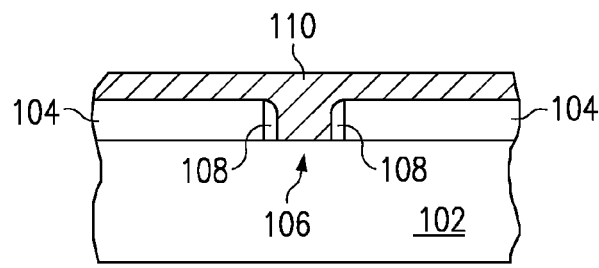
Figure 1D:
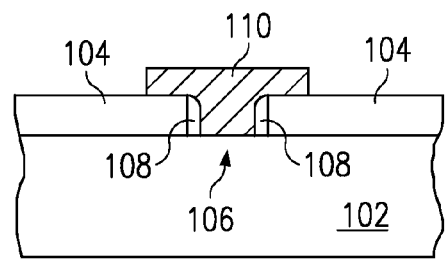

FIG. 1c shows the structure after filling of the trench. The empty trench is filled by depositing a conductor 110 on the structure. FIG. 1d shows the same location after the conductor 110 has been patterned and etched, leaving a contact line of normal width touching the sub-lithographic line. (Alternatively, this structure can be formed using lateral epitaxial growth.) This allows a low resistance contact to be made to the backside of the body of the transistor. (In an alternative embodiment, the surface is planarized after the trench fill, removing all conducting material except that in the trench. This is generally known as a damascene process. As another alternative, the sublithographic and standard portions of the back contact or back gate can be filled in one step, followed by a single planarization. This is generally known as a double-damascene process.)

If the back-gate structure (gate or contact) is formed by a pattern and etch process instead of a damascene or double-damascene process, the structure is covered with a dielectric and planarized prior to bonding to a substrate. Following a damascene process, deposition of a dielectric before bonding is optional.

Figure 1E:
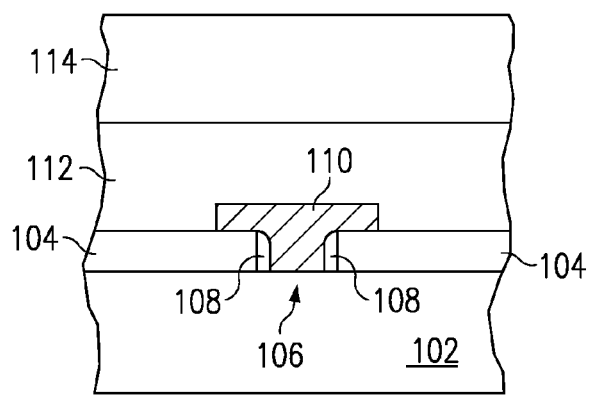

In FIG. 1e, after trench fill and patterning of the conducting interconnect line, the structure covered with an insulator 112 and is bonded to a substrate 114. The material which is bonded is preferably made of oxide (the insulator) on silicon (the substrate), but can also be any other planar material, such as quartz or glass, that will hold up through the remaining process steps. The entire structure is then flipped, the semiconductor body then being thinned to the desired thickness for device fabrication. Thinning is preferably done using a splitting process. The gate is formed above the sub-lithographic conducting connection as shown.

In another embodiment, the sub-lithographic back gate structure is formed on a substrate and the transistor layer is formed over the sublithographic back structure, as with lateral growth epitaxy, or bonding.

The connection to the back side of the transistor allows the floating body to have a definite voltage reference rather than remain floating. Manipulating the body effects and the relative voltage between the body and the source allows adjustment of the threshold voltage of the device. Alternatively, the contacted body can be left floating, the back side contact providing increased thermal conduction to remove heat.

Using a connection that is less than the minimum lithographic width allows added margin in alignment of the connection to the gate. Misalignment in either direction places the conducting material from the connection closer to one side of the gate than the other, putting the conductor in proximity with the source or drain and increasing parasitic effects.

FIGS. 2a-2d show another embodiment of the present innovations. In this variation, the initial substrate does not serve as the transistor body, and the device is fabricated "upside down" with respect to the embodiment described in FIG. 1.

Figure 2A:
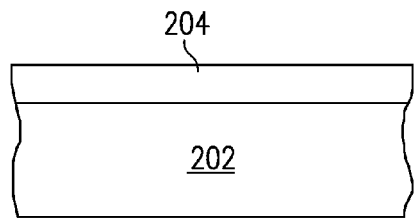
FIGS. 2a-2d show a partially fabricated integrated circuit structure at different process steps according to a preferred embodiment.
Figure 2B:
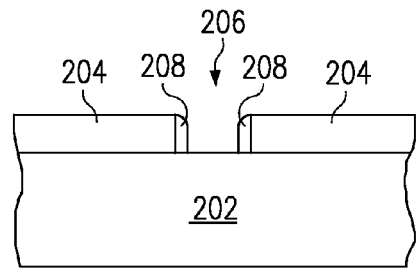
Figure 2C:
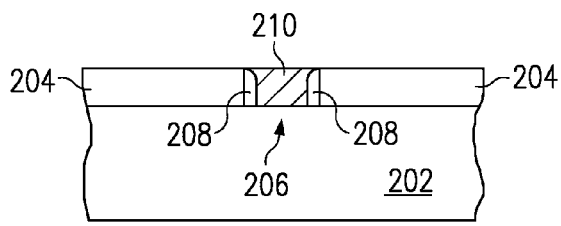

In FIG. 2a, the substrate 202 is covered with an insulating layer 204, preferably oxide. The thickness of this insulating layer is about 500 nm thick. In FIG. 2b, the insulating layer has a trench 206 etched therein. The trench is patterned and etched using known lithographic means, and is designed to be of substantially minimum possible width with respect to the technology, about 100 nm wide with present art. The initial trench may be of greater than minimum possible width, to relax process requirements. The trench has sidewalls 208 formed on the sides, further decreasing the trench width to sublithographic dimension. As shown in FIG. 2c, the trench is then filled with a conducting material 210, preferably polysilicon, and then planarized to remove any conducting material from the surface. Note that in some variations, a conducting interconnect can be made to the trench fill material.

Figure 2D:
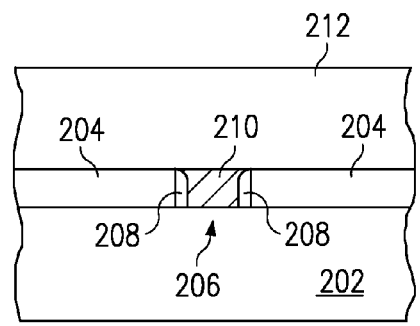

FIG. 2d shows the structure after bonding to a semiconductor body 212. The semiconductor material is then thinned to the desired thickness for fabricating devices therein. Alternatively, the semiconductor body 212 may be formed by deposition or epitaxial growth.

In an alternative embodiment, the conducting trench is not contiguous with the semiconductor material which serves as the device body. Instead, a thin layer of insulating material (preferably oxide) is placed on the surface after planarization and before the semiconductor material is formed, such as by bonding, deposition or lateral epitaxial growth. This insulating layer is interposed between the metal trench-fill and the device body. If the trench fill material is silicon, the insulating layer may be formed by oxidation. This back gate technique is preferably used for fully depleted SOI structures, where a back gate structure will have more influence than in partially depleted SOI.

Figure 3:
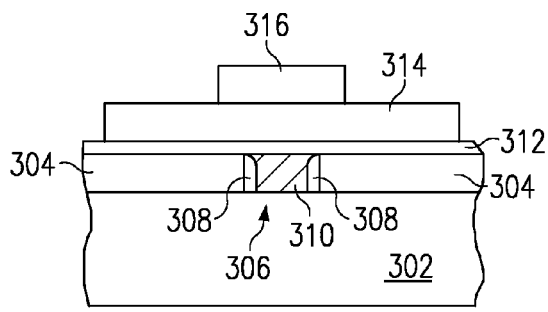
FIG. 3 shows an embodiment with an added insulating layer.

FIG. 3 shows an example of such an embodiment. In fully depleted SOI, there is no undepleted region beneath the channel for a conducting connection. An insulating layer is therefore added, interposed between the semiconductor and the conducting trench fill material. This forms a back gate structure or buried gate structure within the insulating region beneath the channel.

FIG. 3 shows a substrate 302 covered by a layer of insulating material 304, preferably oxide. A trench 306 is etched in the oxide, followed by formation of sidewalls 308 in the trench. A conducting material 310 (preferably polysilicon) is deposited in the trench. (Note that in some embodiments, an electrical interconnect is also present, connecting the trench fill material to another voltage element.) The surface is then planarized and covered by another insulating layer of oxide 312, followed by formation of the active area 314 and the gate 316.

The same structure (i.e., having an insulating layer between the trench fill and the semiconductor body) can also be implemented in partially depleted SOI structures. This creates capacitive coupling to the body region. Though the partially depleted variation has less influence on the threshold voltage than the fully depleted variation, it does allow dynamic influence of the threshold voltage. If the insulating layer is thin enough, both the front and back channels will be active, creating two separate channels for the devices. Control of the back gate voltage influences the threshold voltage. Alternatively, the insulating layer may be formed on the active area material prior to bonding to the back gate structure. The back gate may be connected to the front gate for double gate transistors, generally fully depleted.

In another embodiment of the present innovations, the trench fill material is used to reduce the resistance along the width of the device.

Figure 4:
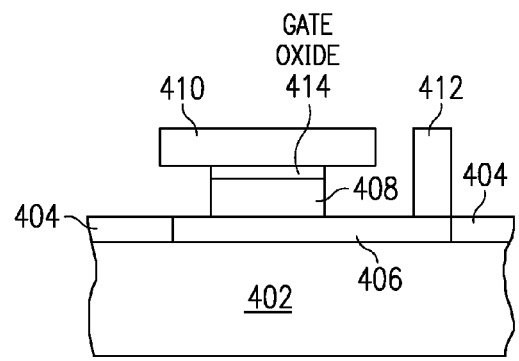
FIG. 4 shows an alternative embodiment wherein the trench fill material makes a low resistance contact to a device.

FIG. 4 shows a substrate material 402 with an insulating layer 404 and the conducting trench filler 406. And a transistor comprises a body of active material 408 that covers the trench filler 406, gate structure 410 over the active body 408, and a gate oxide 411 is also shown.

As shown in FIG. 4, the trench fill material 406 extends beyond the end of the device, exposing material past the gate 410. Contact is made to the semiconductor body at 412. The trench fill material 406 also extends along the width of the device, from one end of the gate to the other in the preferred embodiment, reducing the resistance along the transistor. This allows for a low resistance connection to be made to the transistor.

DEFINITIONS

Following are short definitions of the usual meanings of some of the technical terms which are used in the present application. (However, those of ordinary skill will recognize whether the context requires a different meaning.) Additional definitions can be found in the standard technical dictionaries and journals.

SOI: Semiconductor-On-Insulator.

Sublithographic: refers to a dimension which is smaller than that currently possible with normal lithographic technology.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Additional general background, which help to show the knowledge of those skilled in the art regarding variations and implementations of the disclosed inventions, may be found in the following documents, all of which are hereby incorporated by reference: Coburn, PLASMA ETCHING AND REACTIVE ION ETCHING (1982); HANDBOOK OF PLASMA PROCESSING TECHNOLOGY (ed. Rossnagel); PLASMA ETCHING (ed. Manos and Flamm 1989); PLASMA PROCESSING (ed. Dieleman et al. 1982); Schmitz, CVD OF TUNGSTEN AND TUNGSTEN SILICIDES FOR VLSI/ULSI APPLICATIONS (1992); METALLIZATION AND METAL-SEMICONDUCTOR INTERFACES (ed. Batra 1989); VLSI METALLIZATION: PHYSICS AND TECHNOLOGIES (ed. Shenai 1991); Murarka, METALLIZATION THEORY AND PRACTICE FOR VLSI AND ULSI (1993); HANDBOOK OF MULTILEVEL METALLIZATION FOR INTEGRATED CIRCUITS (ed. Wilson et al. 1993); Rao, MULTILEVEL INTERCONNECT TECHNOLOGY (1993); CHEMICAL VAPOR DEPOSITION (ed. M. L. Hitchman 1993); and the semiannual conference proceedings of the Electrochemical Society on plasma processing.

What is claimed is:

1. A fabrication method, comprising the steps of:
   providing a substrate with an insulating layer thereon;
   etching a trench in said insulating layer, said trench having a width;
   following said etching, forming sidewalls on the sides of said etched trench; thereby narrowing said width;
   after forming the sidewalls, filling said trench with a conducting material;
   providing a semiconductor material including an active area over said insulating layer and filled trench; and
   forming a transistor gate structure over said active area;
   wherein said conducting material is aligned with a transistor channel defined by said active area below said gate structure.

2. The method of claim 1, wherein said conducting material also contacts a conducting interconnect structure.

3. The method of claim 1, wherein said sidewalls in said trench reduce the width of said trench to sublithographic dimension.

4. The method of claim 1, wherein said conducting material contacts said semiconductor material.

5. The method of claim 1, wherein said conducting material is separated from said semiconductor material by a dielectric material.

6. The method of claim 1, wherein said sidewalls are formed by depositing an oxide material within said etched trench, and etching said deposited oxide material using an anisotropic etch.

7. The method of claim 1, wherein filling said trench with said conducting material comprises depositing a layer of conductive material over said insulating layer and said trench, and patterning and etching said deposited layer of conductive material to fill said trench and leave a conducting interconnect line over said insulating layer above said trench.

8. The method of claim 7, further comprising covering said insulating layer, filled trench and conducting interconnect line with a second insulating layer; and wherein providing said semiconductor material comprises bonding a semiconductor body to said second insulating layer.

9. The method of claim 8, wherein the semiconductor body comprises silicon, and the second insulating layer comprises oxide.

10. The method of claim 1, wherein providing said semiconductor material comprises bonding to a semiconductor body.

11. The method of claim 1, wherein providing said semiconductor material comprises forming said semiconductor material by deposition or epitaxial growth.

12. The method of claim 1, wherein said insulating layer with said filled trench forms a back gate structure or buried gate structure beneath said channel.

* * * * *